United States Patent
Han et al.

(10) Patent No.: US 11,385,746 B2
(45) Date of Patent: Jul. 12, 2022

(54) ELECTROLUMINESCENT DEVICE, TOUCH PANEL, AND TOUCH DISPLAY DEVICE

(71) Applicant: BOE TECHNOLOGY GROUP CO., LTD., Beijing (CN)

(72) Inventors: Xinbin Han, Beijing (CN); Hui Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 673 days.

(21) Appl. No.: 16/098,477

(22) PCT Filed: Jan. 9, 2018

(86) PCT No.: PCT/CN2018/071838
§ 371 (c)(1),
(2) Date: Nov. 2, 2018

(87) PCT Pub. No.: WO2018/205668
PCT Pub. Date: Nov. 15, 2018

(65) Prior Publication Data
US 2021/0240300 A1    Aug. 5, 2021

(30) Foreign Application Priority Data
May 12, 2017   (CN) .......................... 201710335597.9

(51) Int. Cl.
*G06F 3/045* (2006.01)
*G06F 3/044* (2006.01)
(Continued)

(52) U.S. Cl.
CPC ............ *G06F 3/0443* (2019.05); *G06F 3/045* (2013.01); *G06F 3/0412* (2013.01);
(Continued)

(58) Field of Classification Search
None
See application file for complete search history.

(56) References Cited

U.S. PATENT DOCUMENTS

| | | | |
|---|---|---|---|
| 10,319,753 B2 * | 6/2019 | Zhai | H01L 27/1255 |
| 2010/0045612 A1 * | 2/2010 | Molne | G06F 3/04142 |
| | | | 345/173 |

(Continued)

FOREIGN PATENT DOCUMENTS

| CN | 204759381 U | 11/2015 |
|---|---|---|
| CN | 106201112 A | 12/2016 |

(Continued)

OTHER PUBLICATIONS

Search Report and Written Opinion for International Application No. PCT/CN2018/071838 dated Apr. 13, 2018.

*Primary Examiner* — Brian M Butcher
(74) *Attorney, Agent, or Firm* — Calfee, Halter & Griswold LLP

(57) ABSTRACT

The present disclosure relates to an electroluminescent device, a touch panel and a touch display device. The electroluminescent device includes: an array substrate, a first electrode layer, an electroluminescent layer and a second electrode layer. The electroluminescent device further includes a force sensing layer electrically coupled to the first electrode layer and the second electrode layer; wherein the force sensing layer is a strain resistance material layer which outputs a voltage signal under driving of a power supply voltage provided by the first and second electrode layers.

18 Claims, 2 Drawing Sheets

(51) Int. Cl.
*G06F 3/041* (2006.01)
*H01L 27/32* (2006.01)
*H01L 51/52* (2006.01)

(52) U.S. Cl.
CPC ........ *H01L 27/323* (2013.01); *H01L 51/5253* (2013.01); *G06F 2203/04105* (2013.01)

(56) References Cited

U.S. PATENT DOCUMENTS

| | | | |
|---|---|---|---|
| 2010/0302206 A1 | 12/2010 | Yu et al. | |
| 2017/0115781 A1* | 4/2017 | Zeng | H01L 27/3276 |
| 2017/0194364 A1 | 7/2017 | Zhai et al. | |
| 2018/0095582 A1* | 4/2018 | Hwang | H01L 27/3276 |

FOREIGN PATENT DOCUMENTS

| | | |
|---|---|---|
| CN | 106486463 A | 3/2017 |
| CN | 1071685 A | 9/2017 |
| TW | 201044027 A | 12/2010 |

* cited by examiner

ELECTROLUMINESCENT DEVICE, TOUCH PANEL, AND TOUCH DISPLAY DEVICE

CROSS-REFERENCE TO RELATED APPLICATIONS

The present application is the U.S. national phase entry of PCT/CN2018/071838, with an international filing date of Jan. 9, 2018, which claims priority to Chinese Patent Application 201710335597.9, filed May 12, 2017, the entire contents of which are incorporated herein by reference.

TECHNICAL FIELD

The present disclosure relates to display technologies, and particularly to an electroluminescent device, a touch panel having the electroluminescent device and a touch display device having the touch panel.

BACKGROUND

The force touch function is a new touch sensing technology, and touch screens with the force touch function have been applied to high-end smart terminals. Through the force touch function, the smart terminals can sense the touch force, and the operating systems of the smart terminals can respond correspondingly according to the pressing force, which brings a new interactive experience to users.

Organic light emitting diodes (OLEDs) have different light-emitting principles from liquid crystal displays (LCDs). The OLED display technology is widely used in mobile display terminals because of its advantages such as self-luminescence, wide viewing angle, almost infinite contrast, low power consumption, and high reaction speed. In related arts, a display device with the force touch function is mostly implemented by applying a sensor film with force sensing function under the LCD backlight plate or the OLED display BP. The principle is that when an external force or pressure is applied, the self-capacitance of the sensor film material to the ground changes, and the force touch function is realized by detecting the amount of change.

SUMMARY

An objective of the present disclosure is to provide an electroluminescent device, a touch panel having the electroluminescent device and a touch display device having the touch panel.

Other features and advantages of the present disclosure will be apparent from the following detailed description.

According to an aspect of embodiments of the present disclosure, there is provided an electroluminescent device, including an array substrate, a first electrode layer, an electroluminescent layer and a second electrode layer;

wherein the electroluminescent device further includes:

a force sensing layer electrically coupled to the first electrode layer and the second electrode layer; wherein the force sensing layer is a strain resistance material layer which outputs a voltage signal under driving of a power supply voltage provided by the first and second electrode layers.

In an exemplary embodiment of the present disclosure, the force sensing layer is disposed between the array substrate and the first electrode layer; or the force sensing layer is disposed between the first electrode layer and the electroluminescent layer; or the force sensing layer is disposed between the electroluminescent layer and the second electrode layer.

In an exemplary embodiment of the present disclosure, the strain resistance material layer includes:

a first strain resistance material layer electrically coupled to the first electrode layer and the second electrode layer;

a second strain resistance material layer which mirrors the first strain resistance material layer, is isolated from the first strain resistance material layer and is electrically coupled to the first electrode layer and the second electrode layer.

In an exemplary embodiment of the present disclosure, the electroluminescent device further includes:

a voltage output end electrically coupled to the first strain resistance material layer and the second strain resistance material layer for outputting the voltage signal which correspondingly changes according to a change in a resistance value of the strain resistance material layer, wherein the resistance value changes when the strain resistance material layer is subjected to a force applied by an external touch operation.

In an exemplary embodiment of the present disclosure, the voltage output end includes:

a first output port electrically coupled to the first strain resistance material layer; and a second output port electrically coupled to the second strain resistance material layer and isolated from the first output port.

In an exemplary embodiment of the present disclosure, the first strain resistance material layer and the second strain resistance material layer include the same geometric pattern.

In an exemplary embodiment of the present disclosure, the geometric pattern includes two sub-geometric patterns that are symmetric with each other.

In an exemplary embodiment of the present disclosure, each of the sub-geometric patterns is a geometric pattern formed by the strain resistance material layer extending in an axial direction and then turning to extend in a radial direction for a predetermined number of times.

In an exemplary embodiment of the present disclosure, the electroluminescent device further includes:

an encapsulation layer stacked on the second electrode layer.

According to another aspect of embodiments of the present disclosure, there is provided a touch display panel, including the electroluminescent device as described above.

According to another aspect of embodiments of the present disclosure, there is provided a touch display device, including the touch display panel as described above.

In an exemplary embodiment of the present disclosure, the touch display device further includes:

a controller configured to determine, according to the voltage signal, a corresponding force value.

The above general description and the following detailed description are intended to be illustrative and not restrictive. This section provides an overview of various implementations or examples of the technical solutions described in this disclosure, and is not a comprehensive disclosure of all of the features of the disclosed technologies.

BRIEF DESCRIPTION OF THE DRAWINGS

The accompanying drawings, which are incorporated in and constitute a part of the specification, show exemplary embodiments of the present disclosure. The drawings along with the description serve to explain the principles of the present disclosure. It is apparent that the drawings in the following description are only some of the embodiments of the present disclosure, and other drawings may be obtained by those skilled in the art without departing from the drawings.

DETAILED DESCRIPTION

Figure 1:
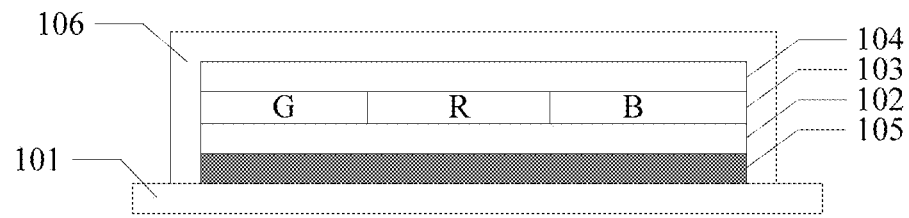
FIG. 1 illustratively shows a schematic diagram of an electroluminescent device according to an exemplary embodiment of the present disclosure.

Exemplary embodiments will now be described more fully with reference to the accompanying drawings. However, the exemplary embodiments can be embodied in a variety of forms and should not be construed as being limited to the examples set forth herein; rather, these embodiments are provided to make this disclosure more complete and convey the concept of the exemplary embodiments to those skilled in this art. The described features, structures, or characteristics may be combined in any suitable manner in one or more embodiments.

In addition, the drawings are merely schematic representations of the present disclosure and are not necessarily to scale. The same reference numerals in the drawings denote the same or similar parts or elements, and repeated descriptions thereof will be omitted.

An exemplary embodiment of the present disclosure provides an electroluminescent device. Referring to FIG. 1, the electroluminescent device may include an array substrate 101, a first electrode layer 102, an electroluminescent layer 103, a second electrode layer 104, and a force sensing layer 105. The force sensing layer 105 is electrically coupled to the first electrode layer 102 and the second electrode layer 104. The force sensing layer 105 is a strain resistance material layer that outputs a voltage signal under driving of a power supply voltage provided by the first electrode layer 102 and the second electrode layer 104.

In the above electroluminescent device, on the one hand, the voltage directly supplied from the two existing electrodes is used to supply electricity to the force sensing layer 105 without an external power source, which simplifies the overall structure and reduces the manufacturing cost; on the other hand, changes in force can be sensed by the strain resistance material, the detection sensitivity and reliability are good, and this can improve the accuracy of the subsequent touch force detection calculation.

Hereinafter, each component of the above electroluminescent device in the present exemplary embodiment will be described in more detail with reference to FIGS. 1 to 5.

In the exemplary embodiment, the array substrate 101 in the electroluminescent device may be a TFT array substrate, the first electrode layer 102 may be an anode electrode layer, and the second electrode layer 104 may be a cathode electrode layer. According to an embodiment, the electroluminescent device may further include an encapsulation layer 106 stacked on the second electrode layer 104. Details of the above components can be found in existing electroluminescent device, and detailed descriptions are not provided herein.

Figure 2:
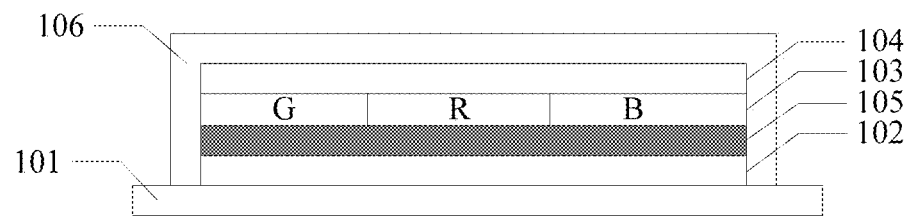
FIG. 2 illustratively shows a schematic view of another electroluminescent device according to an exemplary embodiment of the present disclosure.
Figure 3:
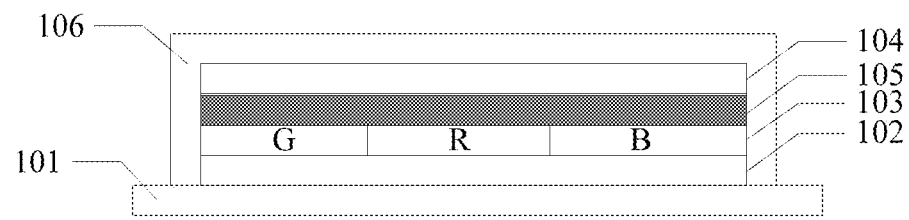
FIG. 3 illustratively shows a schematic diagram of still another electroluminescent device according to an exemplary embodiment of the present disclosure.

Referring to FIG. 1, in the present exemplary embodiment, the force sensing layer 105 may be disposed between the array substrate 101 and the first electrode layer 102, for example, directly disposed on the array substrate 101. In the exemplary embodiment, the force sensing layer 105 is directly disposed on the array substrate 101 as an example. Referring to FIG. 2, in another exemplary embodiment, the force sensing layer 105 may be disposed between the first electrode layer 102 and the electroluminescent layer 103. Referring to FIG. 3, in still another exemplary embodiment, the force sensing layer 105 may be disposed between the electroluminescent layer 103 and the second electrode layer 104. In this embodiment, the force sensing layer 105 can be directly disposed on the TFT array substrate 101, which can improve product yield and work reliability as compared to the application operation in related arts.

In an exemplary embodiment, the force sensing layer 105 may be a strain resistance material layer formed by using a strain resistance material, and the strain resistance material layer is also electrically coupled to the first electrode layer 102 and the second electrode layer 104. That is, the first electrode layer 102 and the second electrode layer 104 provide a power supply voltage to the strain resistance material layer. The strain resistance material layer outputs a voltage signal under the driving of the power supply voltage provided from the first electrode layer 102 and the second electrode layer 104. The two existing electrodes directly provides the voltage to power the force sensing layer without an external power supply, which simplifies the overall structure and reduces the manufacturing cost.

In the exemplary embodiment, the force sensing layer 105 (that is, the force touch layer) may be directly formed on the TFT array substrate 101. The force sensing layer 105 is made of a strain resistance material, and the resistance value of the strain resistance material changes when subjected to pressure or force. For example, when a user performs a sliding touch, click, press, or the like on the surface of the touch screen of a display panel, the strain resistance material of the force sensing layer 105 can be indirectly pressed, and the resistance value of the force sensing layer 105 changes. As an example, the touch screen may include touch sensing electrodes in two orthogonal directions (such as a direction parallel to the gate lines and a direction parallel to the data lines). When a finger of a user touches the touch screen, the voltage/current/capacitance changes fed back by the touch sensing electrodes are detected to determine the touch position. Therefore, it is possible to determine where the pressing event has occurred based on the determined touch position while determining the voltage value change based on the change in the resistance value and thereby determining the force change. It should be noted that the touch position may also be determined by other related existing methods, which will not be described in detail herein. In this way, the force sensing layer 105 is powered by the anode electrode layer voltage VDD and the anode electrode layer voltage VSS in the electroluminescent device, and changes in the voltage value of the force sensing material can be collected to realize the force touch function. For example, according to the collected voltage value, it is possible to realize control operations such as force touch level setting. In this embodiment, the force sensing sensitivity and reliability can be improved by the strain resistance material, so that the accuracy of the subsequent touch pressure calculation is improved. The force sensing layer 105, that is, the strain resistance material layer will be described in detail below.

Figure 4:
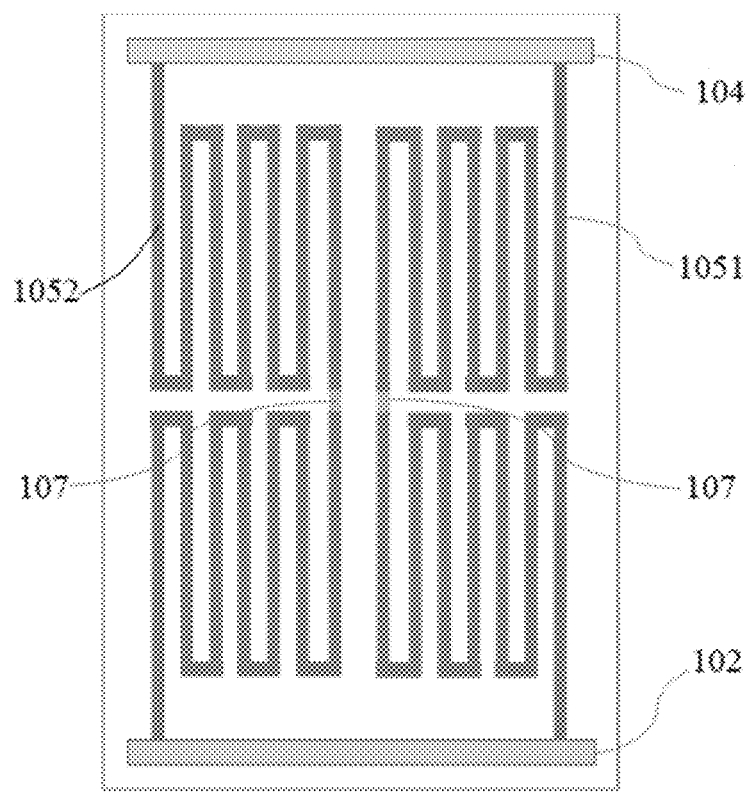
FIG. 4 is a schematic view showing a strain resistance material layer according to an exemplary embodiment of the present disclosure.

Referring to FIG. 4, in an exemplary embodiment, the strain resistance material layer may include a first strain resistance material layer 1051 and a second strain resistance material layer 1052. In this embodiment, the strain resistance material layer is provided a single layer, that is, the first strain resistance material layer 1051 and the second strain resistance material layer 1052 are located in the same plane. The first strain resistance material layer 1051 is electrically coupled to the first electrode layer 102 and the second electrode layer 104. The second strain resistance material layer 1052 mirrors the first strain resistance material layer 1051 and is isolated from the first strain resistance material layer 1051, that is, first strain resistance material layer 1051 and second strain resistance material layer 1052 are independent of each other. The second strain resistance material layer 1052 is electrically coupled to the first electrode layer 102 and the second electrode layer 104. Thus, when the first strain resistance material layer 1051 and the second strain resistance material layer 1052 are subjected to the force (or pressure) applied by the external touch operation, the respective resistance values of the first strain resistance material layer 1051 and the second strain resistance material layer 1052 change and are not completely equal, and thus the voltages across the first strain resistance material layer 1051 and the second strain resistance material layer 1052 can be separately collected. A voltage difference can be obtained according to the two collected voltage values.

Referring to FIG. 4, the electroluminescent device may further include a voltage output end 107. In this embodiment, the voltage output end 107 may include a first output port and a second output port. The first output port is electrically coupled to the first strain resistance material layer 1051. The second output port is electrically coupled to the second strain resistance material layer 1052 and is isolated from the first output port. In this embodiment, the two voltage output ends 107 are symmetrically disposed at an intermediate position between the first strain resistance material layer 1051 and the second strain resistance material layer 1052. In other embodiments, the two voltage output ends 107 can be electrically coupled at any position between the first strain resistance material layer 1051 and the second strain resistance material layer 1052, as long as an electrical signal can be output. The voltage output end 107 is configured to output the voltage signal which correspondingly changes according to the resistance value of the strain resistance material layer to the controller. The resistance value changes when the strain resistance material layer is subjected to a pressure or force applied by an external touch operation. For example, the voltage output end 107 may output the voltage difference between the first strain resistance material layer 1051 and the second strain resistance material layer 1052. The controller can determine the touch force level based on the voltage difference.

For example, the first strain resistance material layer 1051 and the second strain resistance material layer 1052 may include the same geometric pattern, that is, the first strain resistance material layer 1051 and the second strain resistance material layer 1052 may be arranged as a pattern layer to save materials. At the same time, by providing the pattern layer, changes in the resistance value of the strain resistance material layer can be sensitively detected to facilitate accurate detection of the touch force. In this embodiment, the geometric pattern may include two sub-geometric patterns that are symmetric with each other. Exemplarily, each of the sub-geometric patterns is a geometric pattern formed by the strain resistance material layer extending in an axial direction and then turning to extend in a radial direction for a predetermined number of times. As shown in FIG. 4, each of the sub-geometric pattern in the exemplary embodiment is a geometric pattern formed by the rectangular strip-shaped strain resistance material layer extending in an axial direction and then turning to extend in a radial direction for six times, like a continuous series of Us. The geometric pattern shown in FIG. 4 is a preferred embodiment, by which the change in the resistance value of the strain resistance material layer can be detected more sensitively, and the detection sensitivity is improved. It can be understood by those skilled in the art that the geometric pattern may also be other geometric patterns, such as a circle, a circle, an ellipse, a rectangle, etc., and embodiments of the present disclosure do not impose specific limitations on this.

Figure 5:
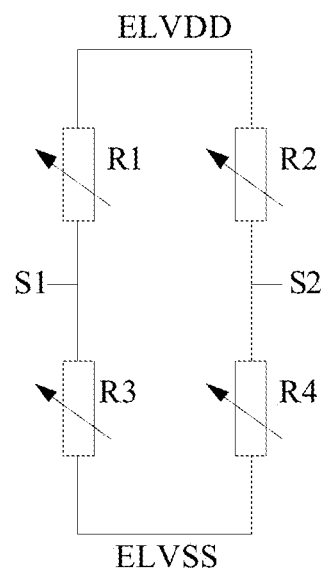
FIG. 5 illustratively shows an equivalent circuit of a strain resistance material layer according to an exemplary embodiment of the present disclosure.

FIG. 5 illustratively shows an equivalent circuit of a strain resistance material layer. S1 and S2 are equivalent to the two ports of the voltage output end 107, R1, R2, R3 and R4 are equivalent force strain resistances, and R1=R2=R3=R4. The input power supply voltages in the circuit are the anode voltage ELVDD and the cathode voltage ELVSS. When there is no force touch, there is no voltage difference between the ports S1 and S2 of the voltage output end 107, and when there is a force touch, there is a change in the resistance of the corresponding resistors among the four equivalent force strain resistors R1, R2, R3 and R4. At this time, there is a voltage difference between the ports S1 and S2. In this way, by detecting whether there is a voltage difference between the two ports S1 and S2, it can be determined whether there is a force touch. By monitoring the magnitude of the voltage difference between the ports S1 and S2, the force touch level can be determined, thereby achieving a relatively accurate touch operation control. Specifically, for example, a relationship table between different voltage difference values and corresponding force touch levels may be preset, and when the controller detects a voltage difference, the controller may determine the force touch level according to the table.

Further, in an exemplary embodiment, there is provided a touch display panel. The touch display panel may include the electroluminescent device according to any one of the above embodiments. Referring to FIG. 1, the electroluminescent device may include an array substrate 101, a first electrode layer 102, an electroluminescent layer 103, a second electrode layer 104, and a force sensing layer 105. The force sensing layer 105 is disposed on the array substrate 101 and electrically coupled to the first electrode layer 102 and the second electrode layer 104. The force sensing layer 105 is a strain resistance material layer which outputs a voltage signal under driving of a power supply voltage provided by the first electrode layer 102 and the second electrode layer 104. For details of the electroluminescent device, reference may be made to the detailed description in the foregoing embodiments, and details are not described herein again.

In an embodiment, the voltage directly supplied from the two existing electrodes is used to supply electricity to the force sensing layer without an external power source, which simplifies the overall structure of the display panel and reduces the manufacturing cost. The force sensing layer is directly disposed on the array substrate, which can improve product yield and work reliability as compared to the application operation in related arts. Further, by sensing changes in force by the strain resistance material, the reliability of detection is good, which can improve accuracy in subsequent calculation of touch force.

There is further provided a touch display device in an exemplary embodiment. The touch display device may include the touch display panel in the above embodiment.

In an exemplary embodiment, the touch display device may further include a controller, and the controller may calculate and determine a corresponding force value according to the voltage signal. For example, the controller may calculate a corresponding force value according to the voltage difference between the ports S1 and S2. A mapping relationship between voltage values and corresponding force values may be preset in the controller, and the controller may determine the force value in table lookup manner. The controller can be a microprocessor, a microcontroller or any other circuit module, chip or the like having logic computing functions. The controller can calculate and determine the force corresponding to the touch operation, thereby achieving accurate touch force control.

In the embodiment, the voltage directly supplied from the two existing electrodes is used to supply electricity to the force sensing layer without an external power source, which simplifies the overall structure of the display panel and reduces the manufacturing cost. The force sensing layer is directly disposed on the array substrate, which can improve product yield and work reliability as compared to the application operation in related arts. Further, by sensing changes in force by the strain resistance material, the reliability of detection is good, which can improve accuracy in subsequent calculation of touch force.

Other embodiments of the present disclosure will be apparent to those skilled in the art. The present application is intended to cover any variations, uses, or adaptations of the present disclosure, which are in accordance with the general principles of the present disclosure and include common general knowledge or conventional technical means in the art that are not disclosed in the present disclosure. The specification and examples are to be regarded as illustrative only, the scope of the present disclosure is defined by the appended claims.

What is claimed is:

1. An electroluminescent device, comprising an array substrate, an anode layer, an electroluminescent layer and a cathode layer which are stacked;
    wherein the anode layer is applied with an anode layer voltage, the cathode layer is applied with a cathode layer voltage, and the electroluminescent layer emits light under driving of the anode layer voltage and the cathode layer voltage from the anode layer and the cathode layer, respectively;
    wherein the electroluminescent device further comprises:
    a force sensing layer electrically coupled to the anode layer and the cathode layer; wherein the force sensing layer is a strain resistance material layer which outputs a voltage signal under driving of the anode layer voltage and the cathode layer voltage provided by the anode layer and the cathode layer, respectively;
    wherein:
    the force sensing layer is disposed between the anode layer and the electroluminescent layer; or
    the force sensing layer is disposed between the electroluminescent layer and the cathode layer.

2. The electroluminescent device according to claim 1, wherein the strain resistance material layer comprises:
    a first strain resistance material layer electrically coupled to the anode layer and the cathode layer;
    a second strain resistance material layer which mirrors the first strain resistance material layer, is isolated from the first strain resistance material layer and is electrically coupled to the anode layer and the cathode layer.

3. The electroluminescent device according to claim 2, further comprising:
    a voltage output end electrically coupled to the first strain resistance material layer and the second strain resistance material layer for outputting the voltage signal which correspondingly changes according to a change in a resistance value of the strain resistance material layer, wherein the resistance value changes when the strain resistance material layer is subjected to a force applied by an external touch operation.

4. The electroluminescent device according to claim 3, wherein the voltage output end comprises:
    a first output port electrically coupled to the first strain resistance material layer; and
    a second output port electrically coupled to the second strain resistance material layer and isolated from the first output port.

5. The electroluminescent device according to claim 2, wherein the first strain resistance material layer and the second strain resistance material layer comprise a same geometric pattern.

6. The electroluminescent device according to claim 5, wherein the geometric pattern comprises two sub-geometric patterns that are symmetric with each other.

7. The electroluminescent device according to claim 6, wherein each of the sub-geometric patterns is a geometric pattern formed by the strain resistance material layer extending in an axial direction and then turning to extend in a radial direction for a predetermined number of times.

8. The electroluminescent device according to claim 7, further comprising:
    an encapsulation layer stacked on the cathode layer.

9. A touch display panel, comprising an electroluminescent device;
    wherein the electroluminescent device comprises an array substrate, an anode layer, an electroluminescent layer and a cathode layer;
    wherein the anode layer is applied with an anode layer voltage, the cathode layer is applied with a cathode layer voltage, and the electroluminescent layer emits light under driving of the anode layer voltage and the cathode layer voltage from the anode layer and the cathode layer, respectively;
    wherein the electroluminescent device further comprises:
    a force sensing layer electrically coupled to the anode layer and the cathode layer; wherein the force sensing layer is a strain resistance material layer which outputs a voltage signal under driving of the anode layer voltage and the cathode layer voltage provided by the anode layer and the cathode layer, respectively;
    wherein:
    the force sensing layer is disposed between the anode layer and the electroluminescent layer; or
    the force sensing layer is disposed between the electroluminescent layer and the cathode layer.

10. The touch display panel according to claim 9, wherein the strain resistance material layer comprises:
    a first strain resistance material layer electrically coupled to the anode layer and the cathode layer;
    a second strain resistance material layer which mirrors the first strain resistance material layer, is isolated from the first strain resistance material layer and is electrically coupled to the anode layer and the cathode layer.

11. The touch display panel according to claim 10, further comprising:
   a voltage output end electrically coupled to the first strain resistance material layer and the second strain resistance material layer for outputting the voltage signal which correspondingly changes according to a change in a resistance value of the strain resistance material layer, wherein the resistance value changes when the strain resistance material layer is subjected to a force applied by an external touch operation.

12. The touch display panel according to claim 11, wherein the voltage output end comprises:
   a first output port electrically coupled to the first strain resistance material layer; and
   a second output port electrically coupled to the second strain resistance material layer and isolated from the first output port.

13. The touch display panel according to claim 10, wherein the first strain resistance material layer and the second strain resistance material layer comprise a same geometric pattern.

14. The touch display panel according to claim 13, wherein the geometric pattern comprises two sub-geometric patterns that are symmetric with each other.

15. The touch display panel according to claim 14, wherein each of the sub-geometric patterns is a geometric pattern formed by the strain resistance material layer extending in an axial direction and then turning to extend in a radial direction for a predetermined number of times.

16. The touch display panel according to claim 15, further comprising:
   an encapsulation layer stacked on the cathode layer.

17. A touch display device, comprising the touch display panel of claim 9.

18. The touch display device according to claim 17, further comprising:
   a controller configured to determine, according to the voltage signal, a corresponding force value.

* * * * *